US011536691B2

(12) United States Patent
Heien et al.

(10) Patent No.: US 11,536,691 B2
(45) Date of Patent: Dec. 27, 2022

(54) PORTABLE INSTRUMENT FOR FIELD READY ELECTROCHEMICAL EXPERIMENTATION

(71) Applicant: ARIZONA BOARD OF REGENTS ON BEHALF OF THE UNIVERSITY OF ARIZONA, Tucson, AZ (US)

(72) Inventors: Michael L. Heien, Tucson, AZ (US); Drew Farrell, Tucson, AZ (US)

(73) Assignee: ARIZONA BOARD OF REGENTS ON BEHALF OF THE UNIVERSITY OF ARIZONA, Tucson, AZ (US)

(*) Notice: Subject to any disclaimer, the term of this patent is extended or adjusted under 35 U.S.C. 154(b) by 423 days.

(21) Appl. No.: 16/324,404

(22) PCT Filed: Aug. 7, 2017

(86) PCT No.: PCT/US2017/045717
§ 371 (c)(1),
(2) Date: Feb. 8, 2019

(87) PCT Pub. No.: WO2018/031461
PCT Pub. Date: Feb. 15, 2018

(65) Prior Publication Data
US 2019/0170687 A1 Jun. 6, 2019

Related U.S. Application Data

(60) Provisional application No. 62/468,170, filed on Mar. 7, 2017, provisional application No. 62/373,257, filed on Aug. 10, 2016.

(51) Int. Cl.
*G01N 27/48* (2006.01)
*G01R 19/165* (2006.01)
*G01N 27/416* (2006.01)

(52) U.S. Cl.
CPC ......... *G01N 27/48* (2013.01); *G01N 27/4163* (2013.01); *G01R 19/16561* (2013.01); *G01R 19/16566* (2013.01)

(58) Field of Classification Search
CPC ........ G01R 19/16561; G01R 19/16566; G01N 27/48; G01N 27/4163
See application file for complete search history.

(56) References Cited

U.S. PATENT DOCUMENTS 5,374,892 A * 12/1994 Sturrock ................ G01N 27/48
204/407
5,585,733 A * 12/1996 Paglione ................. G01B 7/02
324/676

(Continued)

OTHER PUBLICATIONS

International Search Report Issued for PCT Application No. PCT/US17/45717 dated Oct. 24, 2017, Note: The ISR on the record is on Oct. 25, 2017.

*Primary Examiner* — Jeff W Natalini
(74) *Attorney, Agent, or Firm* — Nguyen Tarbet LLC

(57) ABSTRACT

A low-cost, portable potentiostat capable of performing several different electrochemical experiments (e.g. cyclic voltammetry and anodic stripping voltammetry) was designed. The potentiostat runs on one or more batteries and has a battery life of over two weeks. Further, the potentiostat of the present invention is capable of self-calibrating and has a linear dynamic range spanning several orders of magnitude. It is also capable of saving data onto an onboard data storage card and is able to export the data to a computer for additional analysis. The potentiostat requires no peripheral hardware and is suitable for use by those with even minimal training in electrochemistry.

20 Claims, 15 Drawing Sheets

(56) References Cited

U.S. PATENT DOCUMENTS

| | | | |
|---|---|---|---|
| 5,980,708 A | 11/1999 | Champagne et al. | |
| 6,154,159 A * | 11/2000 | Law | H03M 1/12 |
| | | | 341/122 |
| 6,277,255 B1 * | 8/2001 | Green | G01N 27/4045 |
| | | | 204/401 |
| 2008/0087544 A1 * | 4/2008 | Zhou | G01N 27/48 |
| | | | 204/406 |
| 2008/0223719 A1 * | 9/2008 | Tam | G01N 27/3277 |
| | | | 204/403.01 |
| 2010/0066387 A1 * | 3/2010 | Bosselmann | G01B 15/00 |
| | | | 324/644 |
| 2012/0205258 A1 | 8/2012 | Noble et al. | |
| 2013/0328572 A1 | 12/2013 | Wang et al. | |
| 2016/0123921 A1 | 5/2016 | Li | |

\* cited by examiner

| Feature | Present Invention | Cheapstat (UC Santa Barbara) |
|---|---|---|
| Battery life | 52 hours | 0 |
| Offset limits | ± 1.8 V | ±900 mV |
| Sweep rate limit | ± 10-400 mV/s | Unknown |
| Sweep value limit | ± 2.5 V | ± 900 mV |
| Sample rate | 0-150 Hz | 0-1000 Hz |
| Automated variable gain | 14 gain levels | None |
| Linear dynamic range | ±600pA – 1 mA | 100 na-10 µA |
| Current noise | <150 pA | Unknown |
| Software platforms | Windows, OSX, Linux, SBC | Windows, OSX, Linux |
| Onboard storage | 32 Gb removable | None |
| Headless Operation | Yes | No |
| Total cost | $110.00 | $80 |

FIG. 2

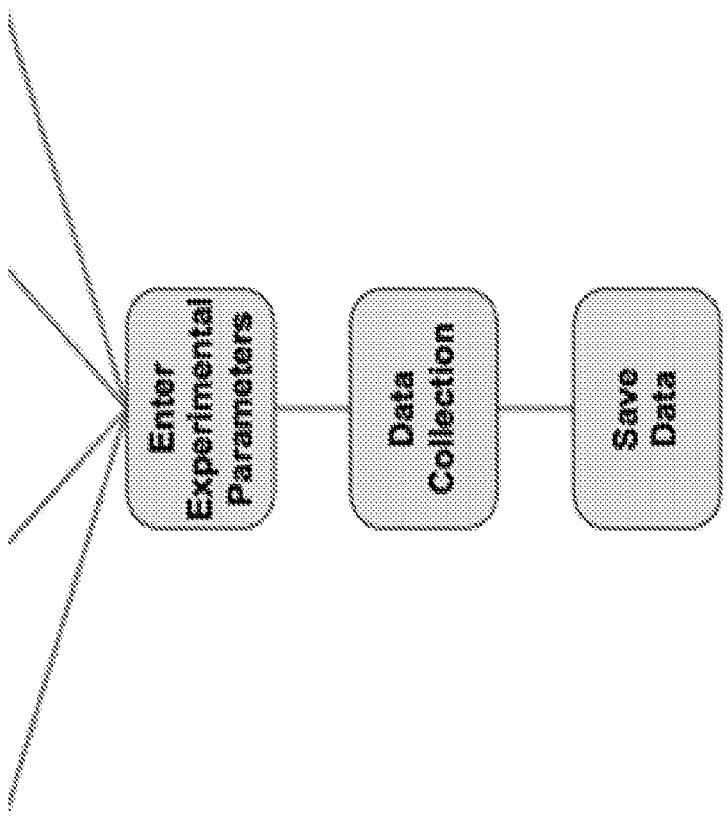
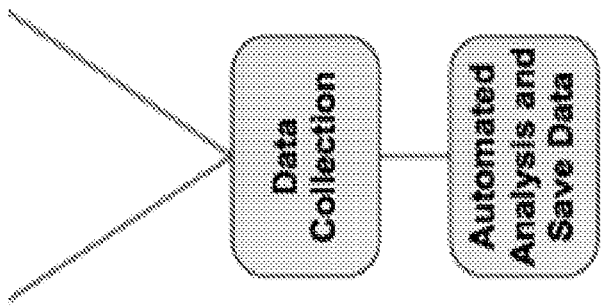
FIG. 7B

PORTABLE INSTRUMENT FOR FIELD READY ELECTROCHEMICAL EXPERIMENTATION

FIELD OF THE INVENTION

The present invention relates to electrochemical experimentation, more specifically, to a fully portable device able to automate electrochemical experiments in the field.

BACKGROUND OF THE INVENTION

Developments in consumer electronics, such as the operational amplifier, charged coupled devices ("CCD"), and microcontrollers have revolutionized the field of measurement science. Specifically, the Arduino platform, an open source prototyping board aimed at building the power of modern microcontrollers into a consumer-friendly environment, was the platform utilized for the simplified design of the potentiostat of the present invention. Employing this tool, a low-cost, portable potentiostat capable of performing several different electrochemical experiments (e.g., cyclic voltammetry and anodic stripping voltammetry) was designed. Potentiostats apply specific voltage (or alternately, potential) patterns to electrodes coupled to a medium of interest (alternately referred to herein as an analyte) and measures the resulting current produced by the analyte. The potential/resulting current relationship obtained by potentiostats may be used to determine chemical properties or concentrations and compositions of items in the analyte.

The portable potentiostat device of the present invention runs on one or more batteries. In an embodiment, the power source is one 3.7 V battery, having a battery life of over two weeks. The present portable potentiostat device is also capable of self-calibrating and has a linear dynamic range spanning several orders of magnitude. This potentiostat is capable of saving data onto an onboard data storage card and is able to export the data to a computer for further analysis. No peripheral hardware is required and the present portable potentiostat device is suitable for use by those with even minimal training in electrochemistry.

Any feature or combination of features described herein are included within the scope of the present invention provided that the features included in any such combination are not mutually inconsistent as will be apparent from the context, this specification, and the knowledge of one of ordinary skill in the art. Additional advantages and aspects of the present invention are apparent in the following detailed description and claims.

SUMMARY OF THE INVENTION

The present invention features a portable potentiostat device effective for decreasing an amount of noise generated in an electrochemical experiment by employing a digital to analog converter ("DAC") coupled to an analog integrating operational amplifier, herein referred to as an integrator, for generating a plurality of increasing and decreasing potentials comprising a potential sweep applied to an analyte during the electrochemical experiment. An analysis and interpretation of a set of experimental data generated by said experiment is performed by the device so that a user, with or without prior knowledge of electrochemistry, is able to execute the electrochemical experiment.

In some embodiments, the portable potentiostat device comprises a potential control module having a reference electrode operatively coupled to a counter electrode. In other embodiments, a waveform control module, comprising the DAC operatively coupled to the integrator, generates the potential sweep. The DAC and the integrator may both be operatively coupled to the reference electrode and to the counter electrode. In one embodiment, the DAC is a 12-bit DAC.

In additional embodiments, an electrochemical cell and a data acquisition module further comprises the portable potentiostat device. In some embodiments, the electrochemical cell comprises an input of the reference electrode, an output of the counter electrode, and an analyte. In an embodiment, the potential sweep is applied to the analyte via the input of the reference electrode and the output of the counter electrode. In supplementary embodiments, the data acquisition module comprises a working electrode operatively coupled to a microcontroller. The data acquisition module may be operatively coupled to the electrochemical cell via the working electrode.

In some embodiments, a user interface is operatively coupled to the data acquisition module via a microcontroller. The user interface may provide the user access to the set of experimental data as well as access to the analysis and interpretation of said data. In some embodiments, the user interface also allows the user to select a specific electrochemical experiment or a pre-determined experimental protocol to be performed. In other embodiments, a power source provides power to the portable potentiostat device. In an embodiment, the power source comprises one or more lithium ion batteries operatively coupled to the reference electrode, the counter electrode, and the working electrode.

Consistent with previous embodiments, during an electrochemical experiment, each potential in the potential sweep produces an electrochemical effect in the analyte such that a change in potential at the working electrode and a resultant current in the analyte are produced. The set of experimental data may comprise, for each potential, the change in potential at the working electrode relative to the potential applied by the reference electrode and a measurement of the resultant current.

In further embodiments, the waveform control module comprises the 12-bit DAC having a first digital input and a second digital input. In some embodiments, the first digital input may be a 1.8 volt reference source and the second digital input may be a 4.1 volt reference source. The 12-bit DAC may employ said reference sources to produce an analog signal. A first inverter and a second inverter each having an input operatively coupled to the output of the 12-bit DAC may further comprise the waveform control module. The first inverter and the second inverter may invert the analog signal to apply the correct voltages to the working electrode relative to the reference electrode.

In supplementary embodiments, the waveform control module also comprises a solid state relay ("SSR") having a first SSR input operatively coupled to the output of the 12-bit DAC and a second SSR input operatively coupled to an output of the second inverter. The SSR may function to control the waveforms comprising the potential sweep, which are applied to the reference and counter electrodes. The SSR allows for switching of an applied potential at precise times (e.g., reversing the direction of the potential applied to the analyte) during the electrochemical experiment. SSR switching also controls whether the applied potential is varying or held constant. In one embodiment, the integrator has a first input operatively coupled to a first SSR output and a second input operatively coupled to a second SSR output.

In another embodiment, an output of the integrator is operatively coupled to an output of the first inverter, the output of the reference electrode, and the input of the counter electrode. In other embodiments, the integrator may use the values output by the 12-bit DAC to precisely generate a linear analog waveform. The linear analog waveform may then be applied as a potential between the working electrode and the reference electrode. Use of the 12-bit DAC, for generating the analog signal from which the plurality of increasing and decreasing potentials comprising the potential sweep are based, decreases experimental noise as compared to use of a digitally controlled step ramp to generate the plurality of increasing and decreasing potentials.

In further embodiments, the output to the waveform control module may be applied at the output of the reference electrode and at the input of the counter electrode. Further, the output of the reference electrode may be operatively coupled to the input of the counter electrode to allow current flow in the electrochemical cell to escape via the counter electrode during the electrochemical experiment.

In additional embodiments, the data acquisition module of the portable potentiostat device comprises a 16-bit analog to digital converter ("ADC"), operatively coupled to an input of the reference electrode, and a gain control module comprising a plurality of resistors of various resistance values. In an embodiment, the gain control module is also operatively coupled to the 16-bit ADC. The data acquisition module may additionally comprise a 2.048 voltage offset source having an output operatively coupled to the gain control module, where an input to the 2.048 voltage offset source is operatively coupled to an output of the working electrode. In other embodiments, a microcontroller is operatively coupled to the gain control module, the 16-bit ADC, the 12-bit DAC, and the SSR.

Consistent with previous embodiments, each resultant current produced by the analyte may be converted to a resulting potential via the working electrode. Each resulting potential may then be offset by 2.5 volts, via the 2.048 voltage offset source, and amplified by the gain control module to be within about 0-4.096 volts. Each resulting potential may then be digitized by the 16-bit ADC and passed to the microcontroller. In exemplary embodiments, the microcontroller may transmit the digitized version of each resulting potential to a data storage module operatively coupled to the microcontroller.

In supplementary embodiments, the gain control module is further configured to perform an adaptive gain control. The adaptive gain control is performed if a resultant current produced by the analyte exceeds a pre-determined threshold. When this occurs, the microcontroller sends a signal to the gain control module to switch to a resistor having a lower resistance value than a currently employed resistor. In this way, the gain of the device is changed and the resultant current is effectively lowered.

In an embodiment, the device further comprises an integrated dummy cell comprising a resistor having a first end operatively coupled to an input of the working electrode. A second end of the resistor may be operatively coupled to the input of the reference electrode and the output of the counter electrode.

In another embodiment, the user interface comprises a touch screen display operatively coupled to a single board computer performing the analysis and interpretation of the set of experimental data. In some embodiments, the touch screen display provides a first selection to the user for calibrating the device, a second selection for choosing anodic stripping voltammetry as the electrochemical experiment to be performed, and a third selection for choosing cyclic voltammetry as the electrochemical experiment to be performed. In other embodiments, the touch screen display displays the set of experimental data and the analysis and interpretation of said data.

Consistent with previous embodiments, after the user makes a selection via the touch screen display, the single board computer communicates said selection to the microcontroller. The microcontroller may then communicate with the waveform control module to produce the potential sweep fitting for anodic stripping voltammetry or cyclic voltammetry based on the selection. In an alternate embodiment, the user may alternately choose to calibrate the device. In an embodiment, calibration entails applying a variety of potentials to the dummy cell and measuring each resultant current. Measurements of the resultant currents may then be compared to expected current values stored in the data storage module. In further embodiments, the microcontroller calculates a correction factor, based on a deviation of a resultant waveform module output potential from expected output potential values, and communicates the correction factor to the 12-bit DAC for adjusting the potential sweep.

Currently existing systems and methodologies have inherent limitations and as such they cannot perform electrochemical experiments without the use an external source of power (e.g., a computer connected to the potentiostat, an electrical outlet, etc.). In contrast, the present invention is capable of performing electrochemical experiments in the field by employing an on-board power source. Additional non-limiting inventive features of the present potentiostat are:

(1) Adaptive gain control: The present device measures the current produced by the analyte during an electrochemical experiment and, if it is about to exceed a predetermined limit, the device will switch to a lower resistor to change the gain and thus lower the current to voltage conversion factor. This allows for continuous, accurate data collection.

(2) Automated acquisition of measurements: The present device enables a user with or without experience in electrochemistry to perform an electrochemical experiment by:
 a. providing an automated calibration, thus freeing the user from having to physically adjust or recalibrate the device and
 b. optionally performing an analysis and interpretation of data collected during the electrochemical experiment.

BRIEF DESCRIPTION OF THE DRAWINGS

The features and advantages of the present invention will become apparent from a consideration of the following detailed description presented in connection with the accompanying drawings in which:

FIG. 2 shows a table comparing the potentiostat of the present device with the Cheapstat.

FIGS. 7A-7B show a flowchart of the portable potentiostat device software of the present invention.

DETAILED DESCRIPTION OF THE INVENTION

Figure 1A:
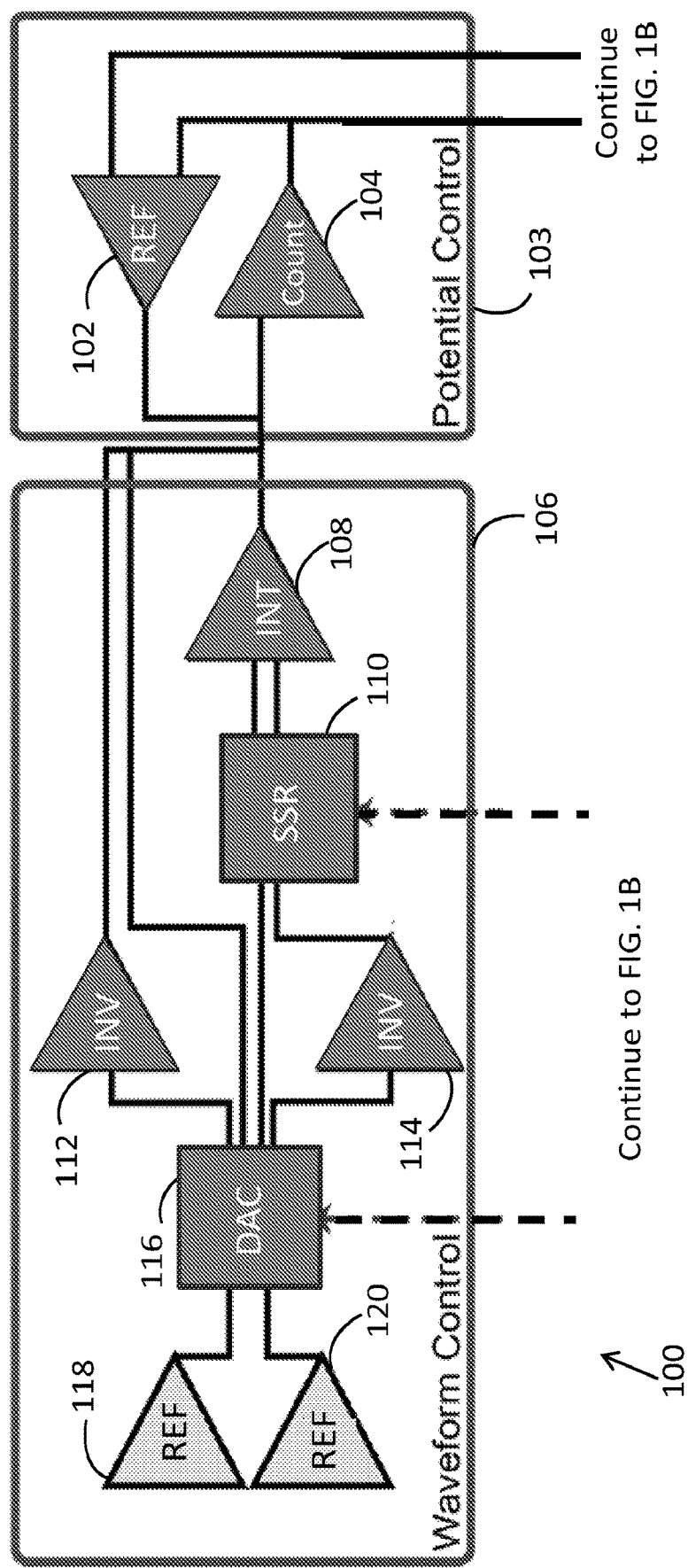
FIGS. 1A-1B show a block diagram of an exemplary embodiment of the present invention.
Figure 1B:
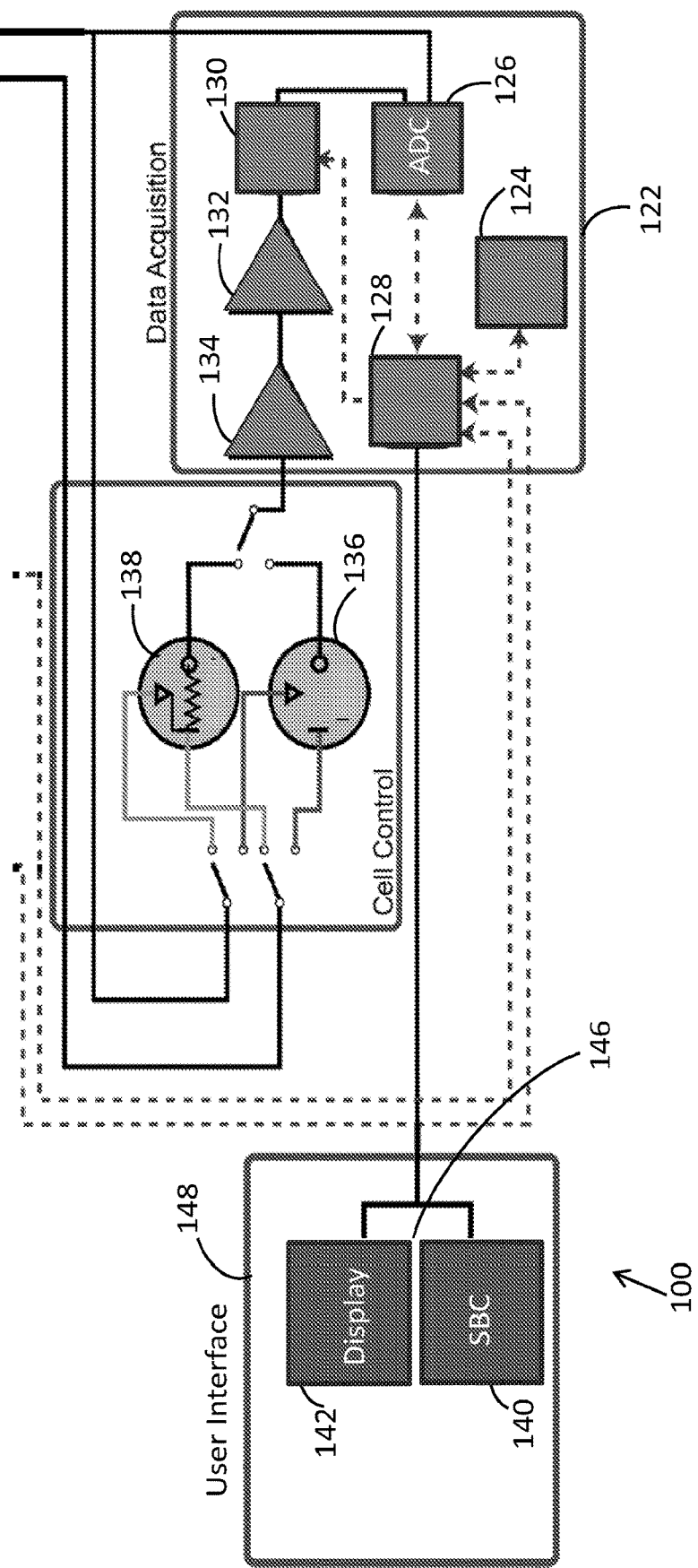
Figure 3:
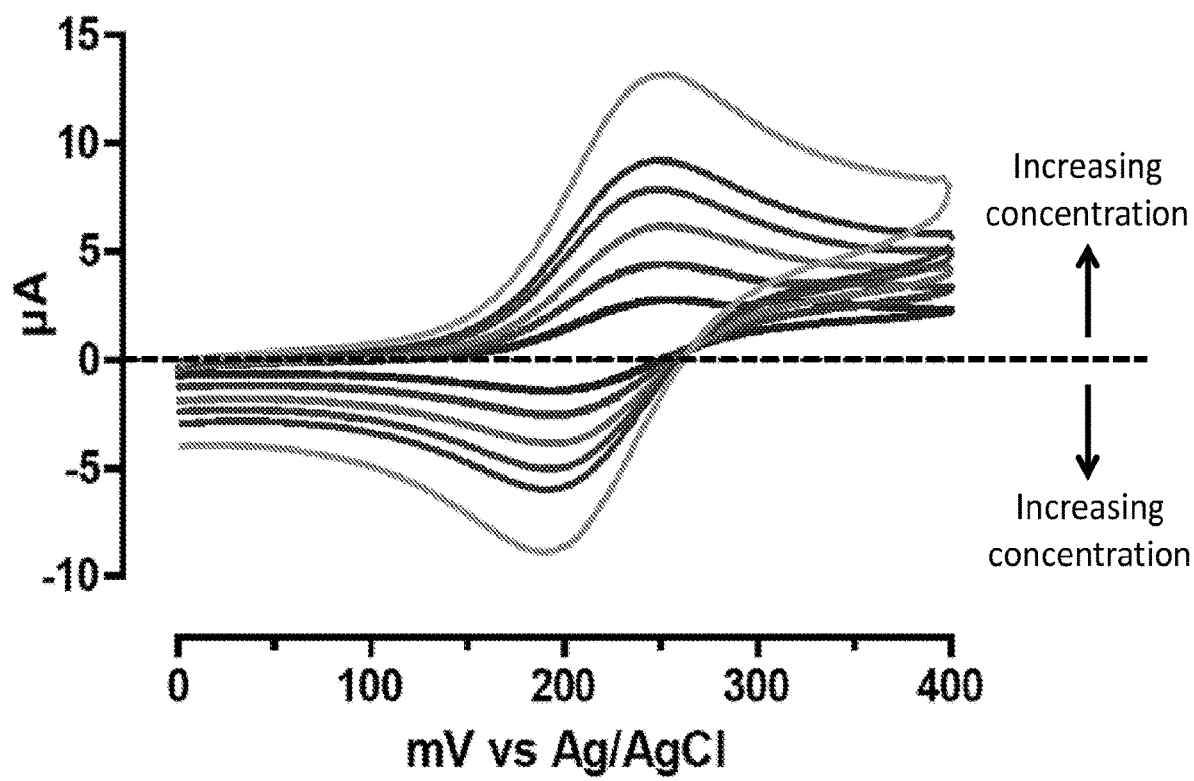
FIG. 3 shows data generated using the present device to perform cyclic voltammetry.
Figure 4:
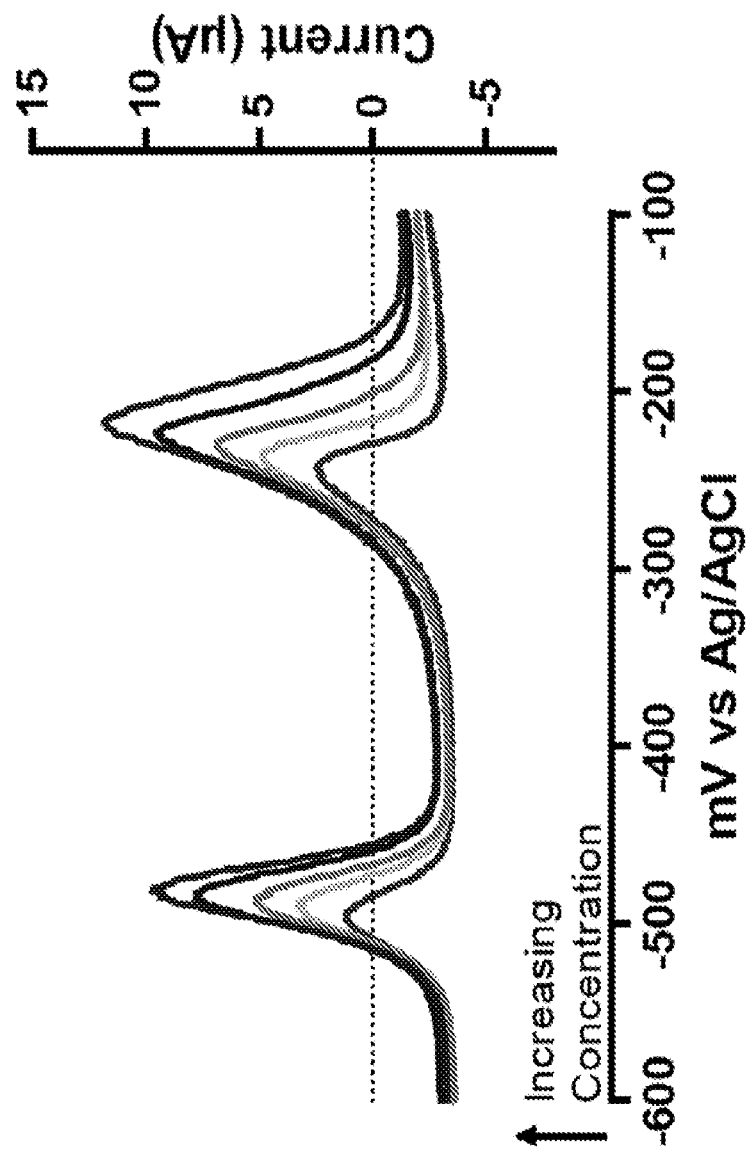
FIG. 4 shows data generated using the present device to perform anodic stripping voltammetry.
Figure 5:
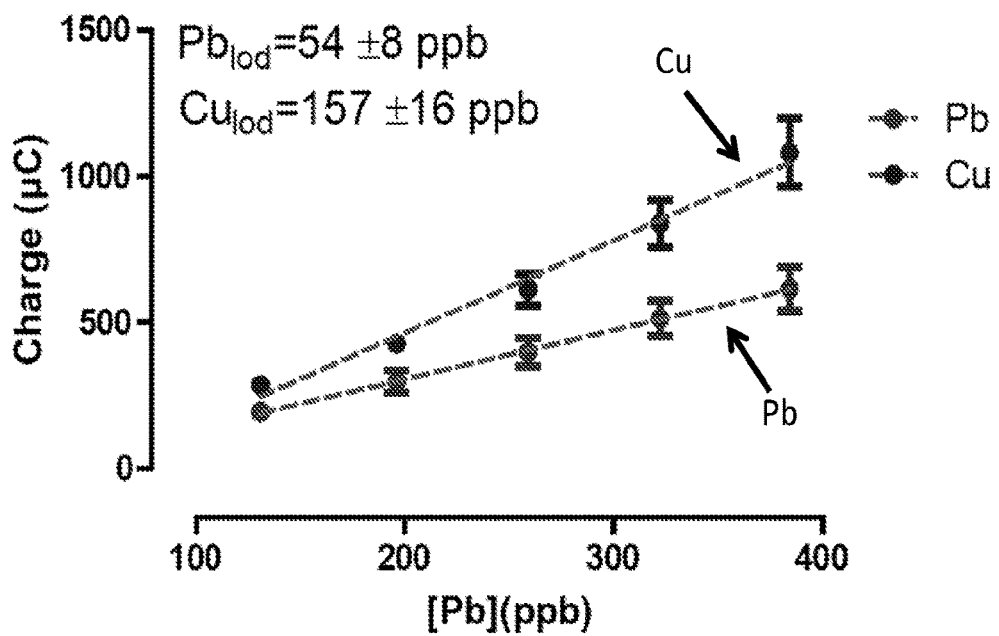
FIG. 5 shows data collected with the present device. Lead and copper concentrations in water were measured and the resulting calibration curves are displayed.
Figure 6:
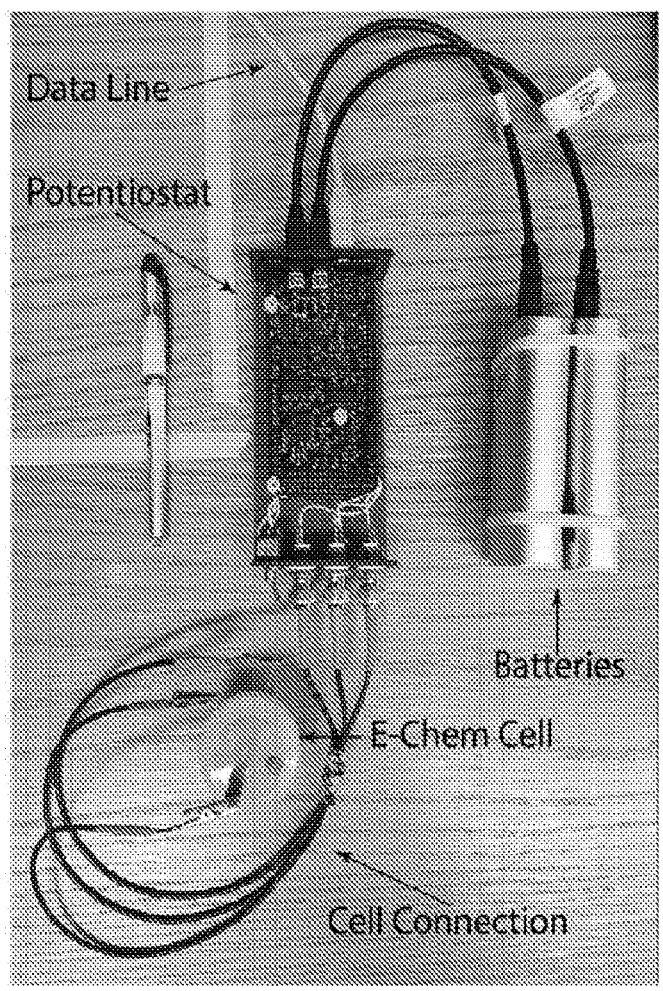
FIG. 6 is a photograph of an embodiment of the portable potentiostat device of the present invention.
Figure 7A:
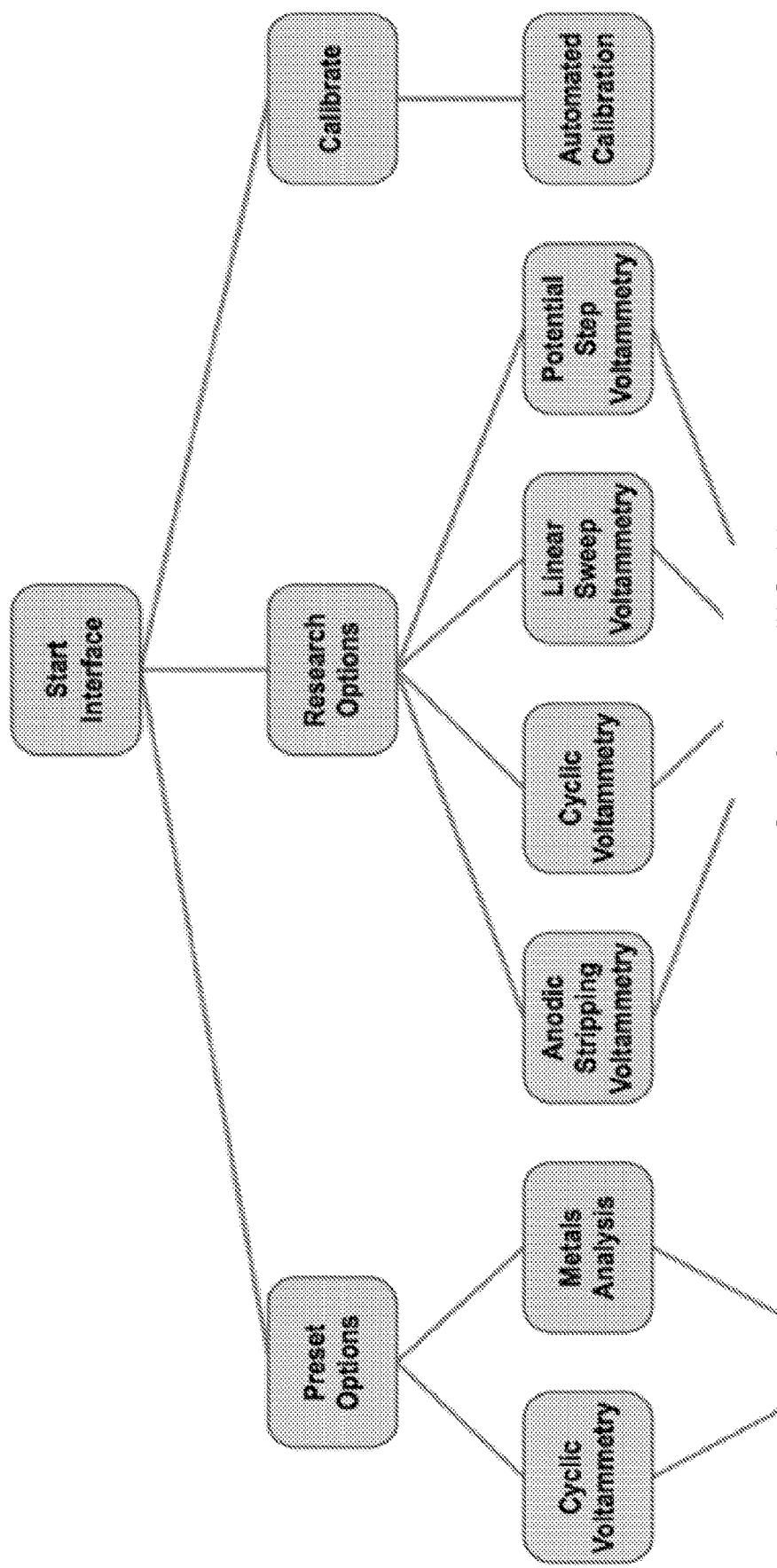
Figure 8:
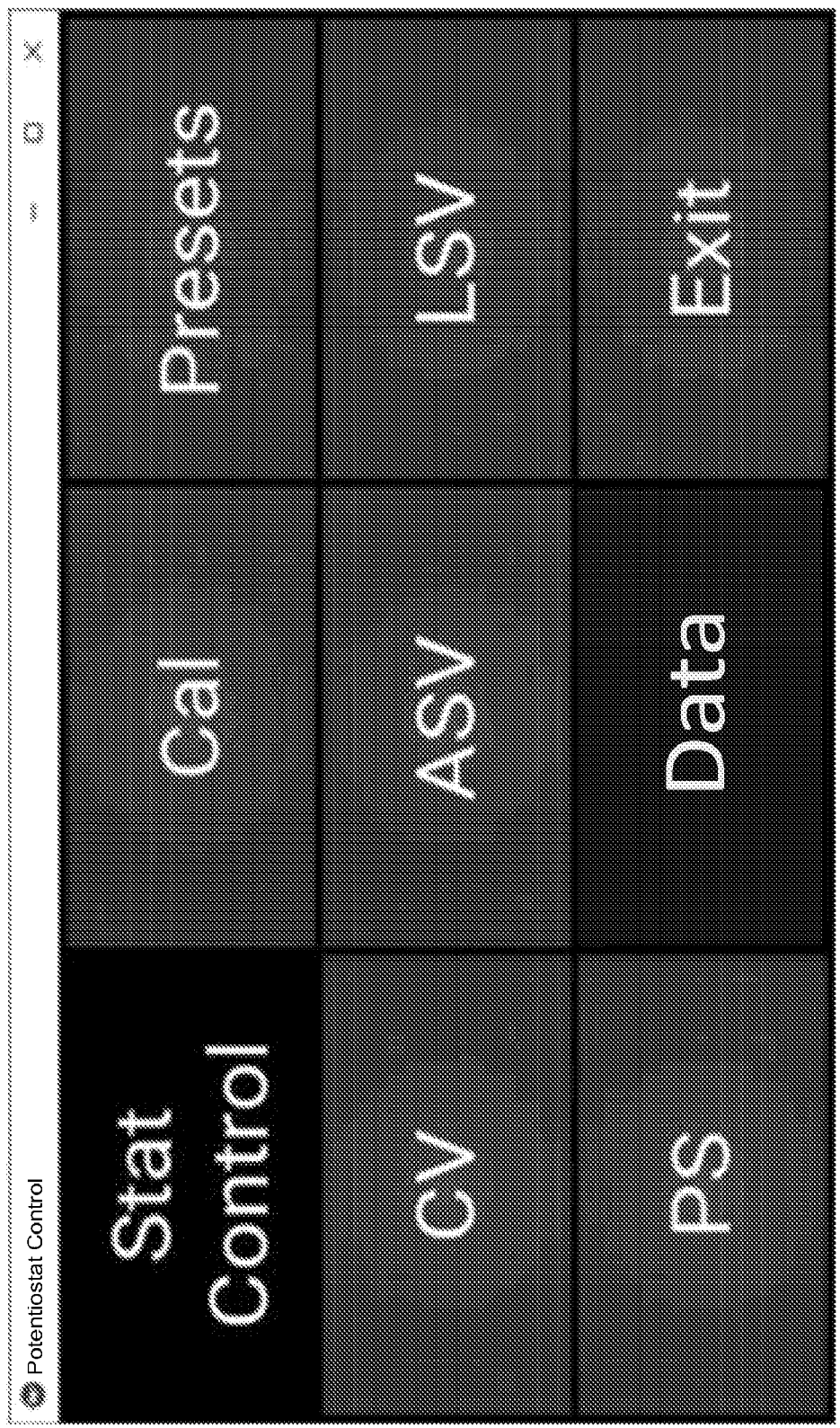
FIG. 8 shows a welcome screen of the user interface of the present invention. The user interface is controlled via a touch screen and may operate on a single board computer or other platform capable of running modern operating systems.
Figure 9:
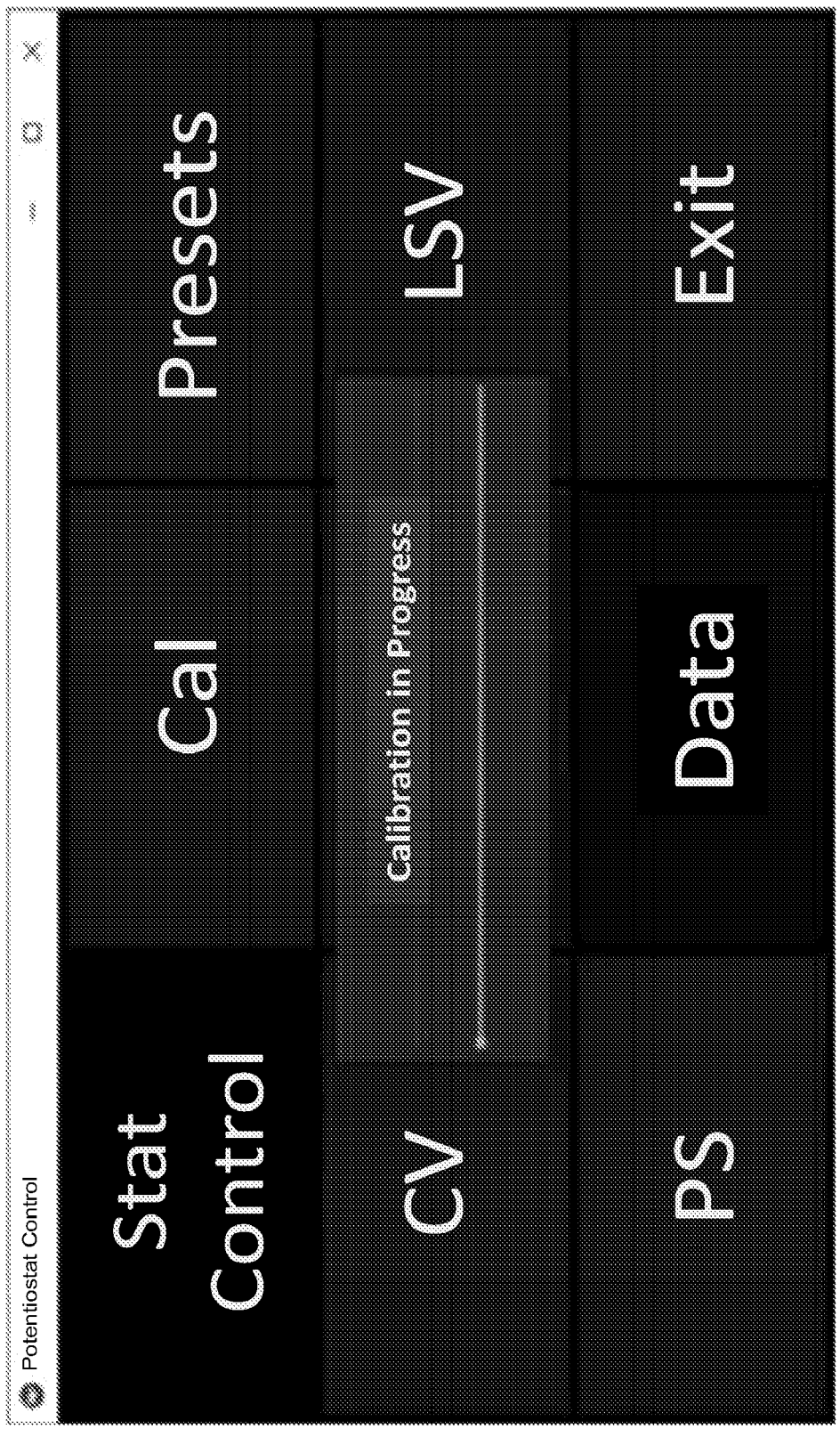
FIG. 9 shows the calibration control screen of the user interface.
Figure 10:
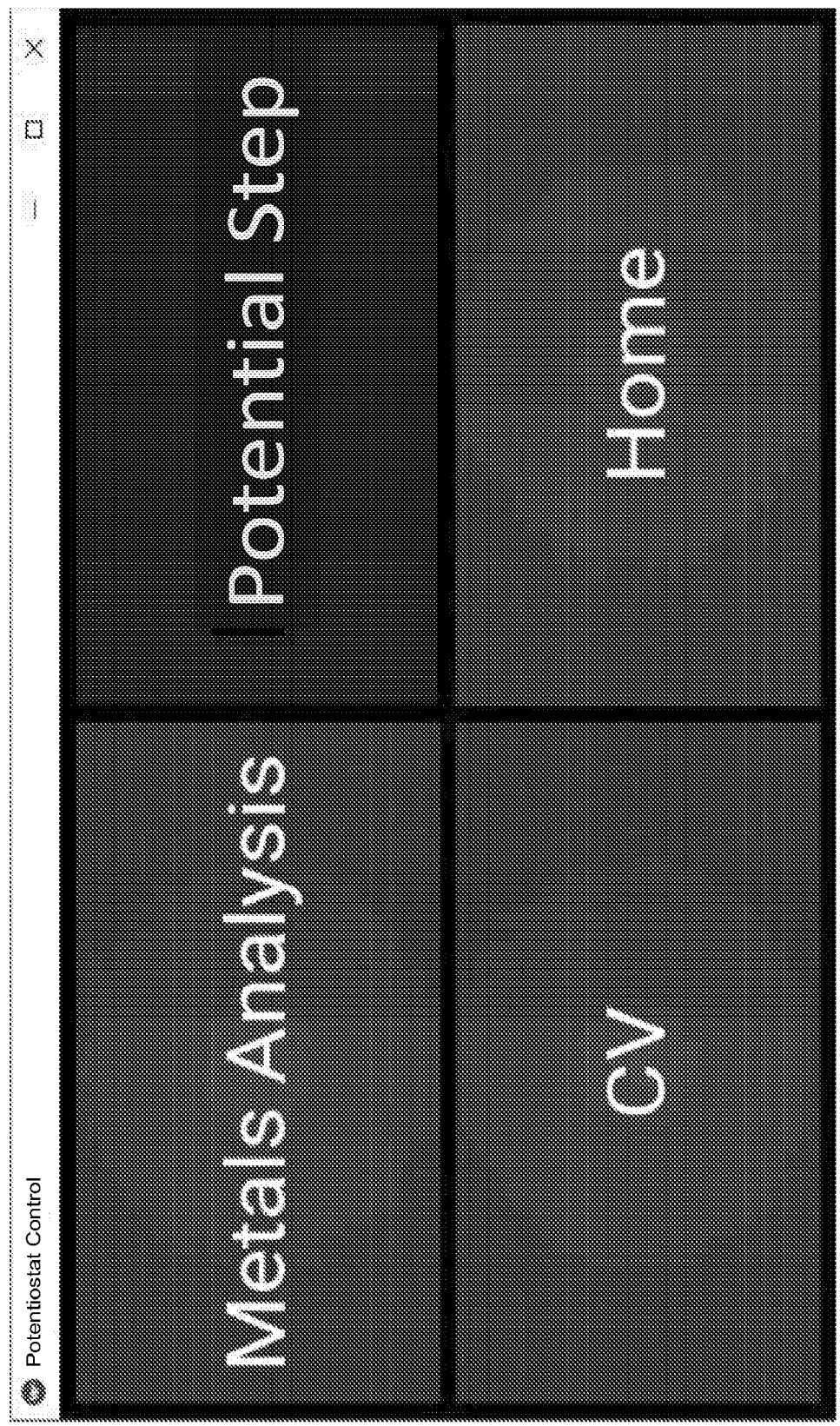
FIG. 10 shows the preset menu on the user interface of the present device.
Figure 11:
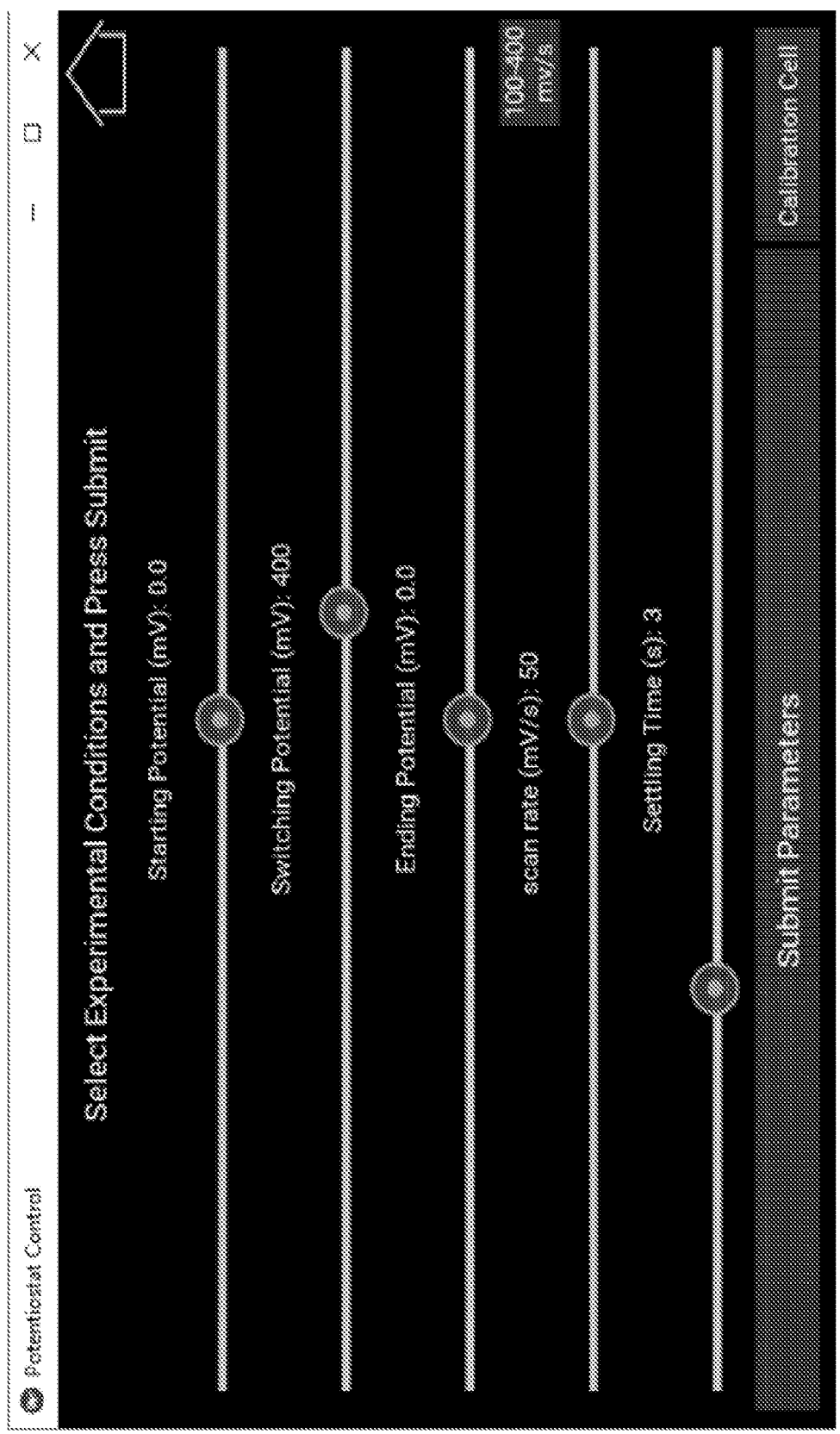
FIG. 11 shows the cyclic voltammetry page of the user interface where the user is able to set desired parameters.
Figure 12:
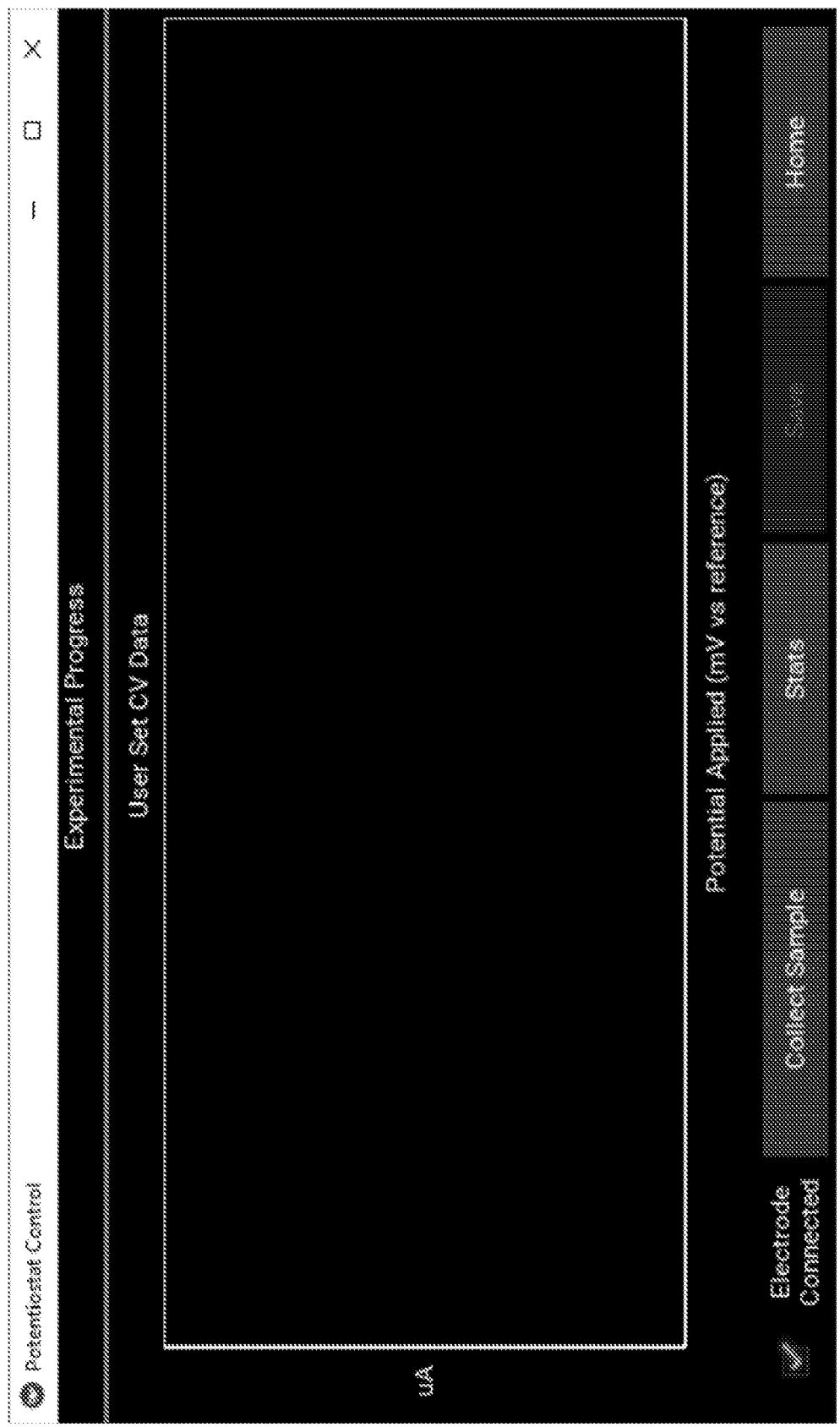
FIG. 12 shows the cyclic voltammetry data collection page of the user interface of the present device.
Figure 13:
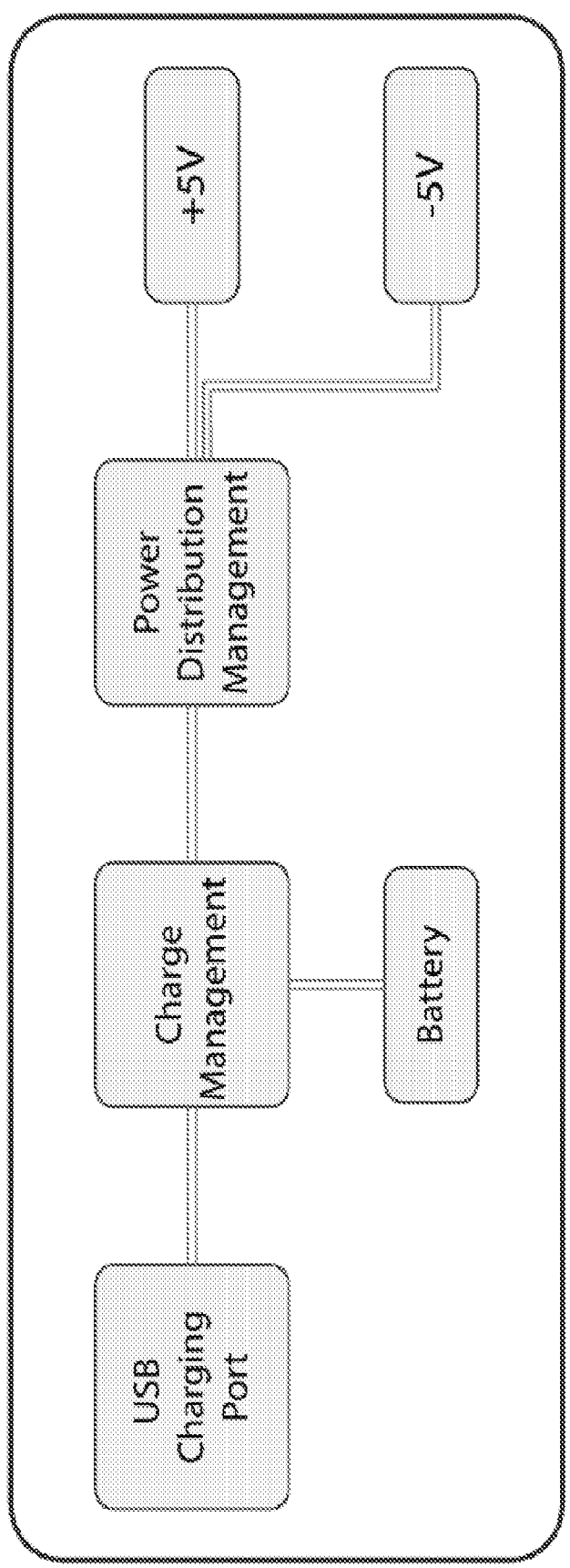
FIG. 13 shows the power management system of the present device.

Referring now to FIGS. 1A-13, the present invention features a portable potentiostat device (100) effective for decreasing an amount of noise generated in an electrochemical experiment by employing a DAC (116) operatively coupled to an integrator (108) for generating a plurality of increasing and decreasing potentials comprising a potential sweep applied to an analyte during the electrochemical experiment. An analysis and interpretation of a set of experimental data generated by said experiment is performed by the device (100) so that a user, with or without prior knowledge of electrochemistry, is able to execute the electrochemical experiment.

In some embodiments, the portable potentiostat device (100) comprises a potential control module (103) having a reference electrode (102) operatively coupled to a counter electrode (104). In other embodiments, a waveform control module (106), comprising the DAC (116) and the integrator (108), generates the potential sweep. The DAC (116) and the integrator (108) may both be operatively coupled to the reference electrode (102) and to the counter electrode (104). In one embodiment, the DAC (116) is a 12-bit DAC (116). In another embodiment, the potential sweep may range from about ±2.0 volts at a sweep rate of about 5 millivolts per second to about 400 millivolts per second. A potential offset of about ±1.8 volts may also be obtained.

In additional embodiments, an electrochemical cell (136) and a data acquisition module (122) further comprises the portable potentiostat device (100). In some embodiments, the electrochemical cell (136) comprises an input of the reference electrode (102), an output of the counter electrode (104), and an analyte. In an embodiment, the potential sweep is applied to the analyte via the input of the reference electrode (102) and the output of the counter electrode (104). In supplementary embodiments, the data acquisition module (122) comprises a working electrode (134) operatively coupled to a microcontroller (128). The data acquisition module (122) may be operatively coupled to the electrochemical cell (136) via the working electrode (134).

In some embodiments, a user interface (148) is operatively coupled to the data acquisition module (122) via a microcontroller (128). The user interface (148) may provide the user access to the set of experimental data as well as access to the analysis and interpretation of said data. In some embodiments, the user interface (148) also allows the user to select a specific electrochemical experiment or a pre-determined experimental protocol to be performed.

In other embodiments, a power source provides power to the portable potentiostat device (100). In an embodiment, the power source comprises one or more regulated lithium ion batteries operatively coupled to the reference electrode (102), the counter electrode (104), and the working electrode (134).

Consistent with previous embodiments, during an electrochemical experiment, each potential in the potential sweep produces an electrochemical effect in the analyte such that a change in potential at the working electrode (134) and a resultant current in the analyte are produced. The set of experimental data may comprise, for each potential, the change in potential at the working electrode (134) relative to the potential applied by the reference electrode (102) and a measurement of the resultant current.

In further embodiments, the waveform control module (106) comprises the 12-bit DAC (116) having a first digital input and a second digital input. In some embodiments, the first digital input may be a 1.8 volt reference source (118) and the second digital input may be a 4.1 volt reference source (120). The 12-bit DAC (116) may employ said reference sources to produce an analog signal. A first inverter (112) and a second inverter (114) each having an input operatively coupled to the output of the 12-bit DAC (116) may further comprise the waveform control module (106). The first inverter (112) and the second inverter (114) may invert the analog signal to apply the correct voltages to the working electrode (134) relative to the reference electrode (102).

In supplementary embodiments, the waveform control module (106) also comprises an SSR (110) having a first SSR input operatively coupled to the output of the 12-bit DAC (116) and a second SSR input operatively coupled to an output of the second inverter (114). The SSR (110) may function to control the waveforms comprising the potential sweep, which are applied to the reference and counter electrodes (102,104). The SSR (110) allows for switching of an applied potential at precise times (e.g., reversing the direction of the potential applied to the analyte) during the electrochemical experiment. SSR (110) switching also controls whether the applied potential is varying or held constant. In one embodiment, the integrator (108) has a first input operatively coupled to a first SSR output and a second input operatively coupled to a second SSR output.

In another embodiment, an output of the integrator (108) is operatively coupled to an output of the first inverter (112), the output of the reference electrode (102), and the input of the counter electrode (104). In other embodiments, the integrator (108) may use the values output by the 12-bit DAC (116) to precisely generate a linear analog waveform. The linear analog waveform may then be applied as a potential between the working electrode (134) and the reference electrode (102). Use of the 12-bit DAC (116), for generating the analog signal from which the plurality of increasing and decreasing potentials comprising the potential sweep are based, decreases experimental noise as compared to use of a digitally controlled step ramp to generate the plurality of increasing and decreasing potentials.

In further embodiments, the output to the waveform control module (106) may be applied at the output of the reference electrode (102) and at the input of the counter electrode (104). Further, the output of the reference electrode (102) may be operatively coupled to the input of the counter electrode (104) to allow current flow in the electrochemical cell (136) to escape via the counter electrode (104) during the electrochemical experiment.

In additional embodiments, the data acquisition module (122) of the portable potentiostat device (100) comprises a 16-bit ADC (126), operatively coupled to an input of the reference electrode (102), and a gain control module (130) comprising a plurality of resistors of various resistance values. In an embodiment, the gain control module (130) is also operatively coupled to the 16-bit ADC. The data acquisition module (122) may additionally comprise a 2.048 voltage offset source (132) having an output operatively coupled to the gain control module (130), where an input to the 2.048 voltage offset source (132) is operatively coupled to an output of the working electrode (134). In other embodiments, a microcontroller (128) is operatively coupled to the gain control module (130), the 16-bit ADC (126), the 12-bit DAC (116), and the SSR (110).

Consistent with previous embodiments, each resultant current produced by the analyte may be converted to a resulting potential via the working electrode (134). Each resulting potential may then be offset by 2.048 volts, via the 2.048 voltage offset source (132), and amplified by the gain control module (130) to be within about 0-4.096 volts. Each resulting potential may then be digitized by the 16-bit ADC (126) and passed to the microcontroller (128). In exemplary embodiments, the microcontroller (128) may transmit the digitized version of each resulting potential to a data storage module (124) operatively coupled to the microcontroller (128).

In supplementary embodiments, the gain control module (130) is further configured to perform an adaptive gain control. The adaptive gain control is performed if a resultant current produced by the analyte exceeds a pre-determined threshold. When this occurs, the microcontroller (128) sends a signal to the gain control module (130) to switch to a resistor having a lower resistance value than a currently employed resistor. In this way, the gain of the device (100) is changed and the resultant current to voltage conversion factor is effectively lowered.

In exemplary embodiments, the gain control module (130) comprises two resistors, coupled to a programmable gain amplifier, in a feedback loop. These resistors, controllable by a relay, set two gain stages. The programmable gain amplifier has another seven resistors, leading to 14 gain stages. The module (130) measures the current, and if it is about to exceed a given limit, the device (100) will switch to a lower resistor to change the gain and thus lower the current. The linear dynamic range for the device (100) of the present invention spans six orders-of-magnitude because of the plurality of resistors employed by the gain control module (130). This range allows the user to perform an electrochemical experiment without needing to physically adjust or recalibrate the potentiostat.

In an embodiment, the device (100) further comprises an integrated dummy cell (138) comprising a resistor having a first end operatively coupled to an input of the working electrode (134). A second end of the resistor may be operatively coupled to the input of the reference electrode (102) and the output of the counter electrode (104).

In another embodiment, the user interface (148) comprises a touch screen display (142) operatively coupled to a single board computer (140), which performs the analysis and interpretation of the set of experimental data. In some embodiments, the touch screen display (142) provides a first selection to the user for calibrating the device (100), a second selection for choosing anodic stripping voltammetry as the electrochemical experiment to be performed, and a third selection for choosing cyclic voltammetry as the electrochemical experiment to be performed. In other embodiments, the touch screen display (142) displays the set of experimental data and the analysis and interpretation of said data.

Consistent with previous embodiments, after the user makes a selection via the touch screen display (142), the single board computer (140) communicates said selection to the microcontroller (128). The microcontroller (128) may then communicate with the waveform control module (106) to produce the potential sweep fitting for anodic stripping voltammetry or cyclic voltammetry based on the selection. In an alternate embodiment, the user may alternately choose to calibrate the device (100). In an embodiment, calibration entails applying a variety of potentials to the dummy cell (138) and measuring each resultant current. Measurements of the resultant currents may then be compared to expected current values stored in the data storage module (124). In further embodiments, the microcontroller (128) calculates a correction factor, based on a deviation of the resultant waveform module output potential from expected output potential values, and communicates the correction factor to the 12-bit DAC for adjusting the potential sweep.

The present invention further features a method for performing an electrochemical experiment via a portable potentiostat device. The device is effective for decreasing an amount of noise generated in an electrochemical experiment by employing a DAC coupled to an analog integrating op amp to generate a plurality of increasing and decreasing potentials comprising a potential sweep applied to an analyte during the electrochemical experiment. Additionally, an analysis and interpretation of a set of experimental data generated by the electrochemical experiment is performed so that a user, with or without prior knowledge of electrochemistry, is able to execute the electrochemical experiment using the portable potentiostat device.

In some embodiments, the method comprises providing the portable potentiostat device comprising:

a potential control module comprising a reference electrode operatively coupled to a counter electrode;

a waveform control module, comprising the DAC operatively coupled to an integrator, for generating the potential sweep, wherein the DAC and the integrator are each operatively coupled to the reference electrode and to the counter electrode;

an electrochemical cell comprising an input of the reference electrode, an output of the counter electrode, and the analyte;

a data acquisition module comprising a microcontroller operatively coupled to a gain control module comprising a plurality of resistors of various resistance values, wherein the data acquisition module also comprises a working electrode, which couples the gain control module to the electrochemical cell;

a user interface comprising a touch screen display and a single board computer both operatively coupled to the microcontroller, wherein the single board computer is operatively coupled to the touch screen display and performs the analysis and interpretation of the set of experimental data; and a power source providing power to the reference electrode, the working electrode, and the counter electrode thus enabling portability of the portable potentiostat device.

In exemplary embodiments, an electrochemical experiment may be initiated by selecting a type of experiment to be performed, via the touch screen display, where a first selection is anodic stripping voltammetry and a second selection is cyclic voltammetry. A first signal indicating the type of experiment to be performed may then be transmitted to a microcontroller via the single board computer. In response, the microcontroller may send a second signal to a waveform control module.

In further embodiments, the second signal may indicate a type of a potential sweep to be generated by the waveform control module. For example, a potential sweep characterizing anodic stripping voltammetry is generated when anodic stripping voltammetry is selected or a potential sweep characterizing cyclic voltammetry is generated when cyclic voltammetry is selected. In other embodiments, each potential of the potential sweep may be applied to the analyte via the input of the reference electrode and the output of the counter electrode. A resultant current produced by the analyte in response to each potential applied is then measured. In preferred embodiments, an analysis of the set of experimental data, comprising each potential applied and the associated resultant current, is performed and an interpretation of said data is generated via the microcontroller. The set of experimental data or the analysis and interpretation may be displayed via the touch screen display.

In additional embodiments, adaptive gain control is employed if a resultant current exceeds a pre-determined threshold. When this occurs, the microcontroller will send a third signal to the gain control module to switch to a resistor having a lower resistance value than the resistor being currently employed. In this way, the gain of the portable potentiostat device is changed thus effectively lowering the resultant current.

In supplementary embodiments, a user may choose to calibrate the portable potentiostat device via a third selection provided by the touch screen display. In some embodiments, the calibration comprises applying a variety of potentials to an integrated dummy cell and measuring each resultant current. The measurements of these resultant currents may then be compared to expected current values, which are stored by a data storage module coupled to the microcontroller, and adjusted accordingly.

In an embodiment, the potential sweep generated ranges from about ±2.0 volts at a sweep rate of about 5 millivolts per second to about 400 millivolts per second. In another embodiment, the DAC is a 12-bit DAC.

In supplementary embodiments, the waveform control module comprises the 12-bit DAC having a first digital input and a second digital input. In some embodiments, the first digital input may be a 1.8 volt reference source and the second digital input may be a 4.1 volt reference source. The 12-bit DAC may employ said reference sources to produce an analog signal. A first inverter and a second inverter each having an input operatively coupled to the output of the 12-bit DAC may further comprise the waveform control module. The first inverter and the second inverter may invert the analog signal to apply the correct voltages to the working electrode relative to the reference electrode.

In supplementary embodiments, the waveform control module also comprises a solid state relay ("SSR") having a first SSR input operatively coupled to the output of the 12-bit DAC and a second SSR input operatively coupled to an output of the second inverter. The SSR may function to control the waveforms comprising the potential sweep, which are applied to the reference and counter electrodes. The SSR allows for switching of an applied potential at precise times (e.g., reversing the direction of the potential applied to the analyte) during the electrochemical experiment. SSR switching also controls whether the applied potential is varying or held constant. In one embodiment, the integrator has a first input operatively coupled to a first SSR output and a second input operatively coupled to a second SSR output. In another embodiment, an output of the integrator is operatively coupled to an output of the first inverter, the output of the reference electrode, and the input of the counter electrode. In other embodiments, the integrator may use the values output by the 12-bit DAC to precisely generate a linear analog waveform. The linear analog waveform may then be applied as a potential between the working electrode and the reference electrode. Use of the 12-bit DAC coupled to the integrator, for generating the analog signal from which the plurality of increasing and decreasing potentials comprising the potential sweep are based, decreases experimental noise as compared to use of a digitally controlled step ramp to generate the plurality of increasing and decreasing potentials.

In further embodiments, the output to the waveform control module may be applied at the output of the reference electrode and at the input of the counter electrode. Further, the output of the reference electrode may be operatively coupled to the input of the counter electrode to allow current flow in the electrochemical cell to escape via the counter electrode during the electrochemical experiment.

In additional embodiments, the data acquisition module of the portable potentiostat device comprises a 16-bit ADC, operatively coupled to an input of the reference electrode, and a gain control module comprising a plurality of resistors of various resistance values. In an embodiment, the gain control module is also operatively coupled to the 16-bit ADC. The data acquisition module may additionally comprise a 2.048 voltage offset source having an output operatively coupled to the gain control module, where an input to the 2.048 voltage offset source is operatively coupled to an output of the working electrode. In other embodiments, a microcontroller is operatively coupled to the gain control module, the 16-bit ADC, the 12-bit DAC, and the SSRs.

Consistent with previous embodiments, each resultant current produced by the analyte may be converted to a resulting potential via the working electrode. Each resulting potential may then be offset by 2.048 volts, via the 2.048 voltage offset source, and amplified by the gain control module to be within about 0-4.096 volts. Each resulting potential may then be digitized by the 16-bit ADC and passed to the microcontroller. In exemplary embodiments, the microcontroller may transmit the digitized version of each resulting potential to the data storage module.

As used herein, the term "about" refers to plus or minus 10% of the referenced number.

Various modifications of the invention, in addition to those described herein, will be apparent to those skilled in the art from the foregoing description. Such modifications are also intended to fall within the scope of the appended claims. Each reference cited in the present application is incorporated herein by reference in its entirety.

Although there has been shown and described the preferred embodiment of the present invention, it will be readily apparent to those skilled in the art that modifications may be made thereto which do not exceed the scope of the appended claims. Therefore, the scope of the invention is only to be limited by the following claims. Reference numbers recited in the claims are exemplary and for ease of review by the patent office only, and are not limiting in any way. In some embodiments, the figures presented in this patent application are drawn to scale, including the angles, ratios of dimensions, etc. In some embodiments, the figures are representative only and the claims are not limited by the dimensions of the figures. In some embodiments, descriptions of the inventions described herein using the phrase "comprising" includes embodiments that could be described as "consisting of", and as such the written description requirement for claiming one or more embodiments of the present invention using the phrase "consisting of" is met.

The reference numbers recited in the below claims are solely for ease of examination of this patent application, and are exemplary, and are not intended in any way to limit the scope of the claims to the particular features having the corresponding reference numbers in the drawings.

What is claimed is:

1. A portable potentiostat device (100) effective for decreasing an amount of noise generated in an electrochemical experiment by employing a digital to analog converter ("DAC") operatively coupled to an analog integrating operational amplifier (108), herein referred to as an integrator, for generating a plurality of increasing and decreasing potentials comprising a potential sweep applied to an analyte during the electrochemical experiment, wherein an analysis and interpretation of a set of experimental data generated by said experiment is performed by the device (100) so that a user, with or without prior knowledge of electrochemistry, is able to execute the electrochemical experiment, the device (100) comprises:
   (a) a potential control module (103) comprising a reference electrode (102) operatively coupled to a counter electrode (104);
   (b) a waveform control module (106) for generating the potential sweep, the waveform control module (106) comprising the DAC (116), an inverter (114) having an input connected to an output of the DAC, a solid state relay ("SSR") (110) having a first SSR input connected to the output of the DAC and a second SSR input connected to an output of the inverter (114), and the integrator (108) having a first integrator input connected to a first SSR output, a second integrator input connected to a second SSR output, and an integrator output connected to an output of the reference electrode and an input of the counter electrode;
   (c) an electrochemical cell (136) comprising a connection to the reference electrode (102), a connection to the counter electrode (104), and the analyte, wherein the potential sweep is applied to the analyte via the reference electrode (102) and the counter electrode (104);
   (d) a data acquisition module (122) comprising a working electrode (134) operatively coupled to a microcontroller (128), wherein the data acquisition module (122) is operatively coupled to the electrochemical cell (136) via the working electrode (134);
   (e) a user interface (148), operatively coupled to the data acquisition module (122) via the microcontroller (128), providing the user access to the set of experimental data and the analysis and interpretation of said data, wherein the user interface (148) is further configured to allow the user to select a specific electrochemical experiment or run a pre-determined experimental protocol; and
   (f) a power source providing power to the reference electrode (102), the working electrode (134), and the counter electrode (104) thus enabling portability of the device (100), wherein each potential in the potential sweep produces an electrochemical effect in the analyte such that a change in potential at the working electrode (134) and a resultant current in the analyte are produced, wherein the set of experimental data comprises, for each potential, the change in potential at the working electrode (134) relative to the potential applied by the reference electrode (102) and a measurement of the resultant current.

2. The device (100) of claim 1, wherein the potential sweep generated ranges from about ±2.0 volts at a sweep rate of about 5 millivolts per second to about 400 millivolts per second.

3. The device (100) of claim 1, wherein the reference electrode (102) is operatively coupled to the counter electrode (104) to allow current flow in the electrochemical cell (136) during the electrochemical experiment.

4. The device (100) of claim 1, wherein the DAC (116) is a 12-bit DAC (116) employing a first digital input and a second digital input to produce an analog signal.

5. The device (100) of claim 4, wherein the waveform control module (106) further comprises another inverter (112) having an input connected to the output of the 12-bit DAC and an output connected to the output of the integrator,
   wherein use of the 12-bit DAC, for generating the analog signal from which the plurality of increasing and decreasing potentials comprising the potential sweep are based, decreases experimental noise as compared to use of a digitally controlled step ramp to generate the plurality of increasing and decreasing potentials.

6. The device (100) of claim 5, wherein the first digital input is a 1.8 volt reference source (118) and the second digital input is a 4.1 volt reference source (120).

7. The device (100) of claim 5, wherein the data acquisition module (122) further comprises:
   (a) a 16-bit analog to digital converter ("ADC") (126), operatively coupled to the reference electrode (102);
   (b) a gain control module (130), operatively coupled to the 16-bit ADC, comprising a plurality of resistors of various resistance values;
   (c) a 2.048 volt voltage offset source (132) having an output operatively coupled to the gain control module (130), wherein an input to the 2.048 volt voltage offset source (132) is operatively coupled to the working electrode (134);
   wherein the microcontroller (128) is operatively coupled to the gain control module (130), the 16-bit ADC (126), the 12-bit DAC (116), and the SSR (110), wherein the microcontroller (128) executes a set of instructions for analyzing and interpreting the set of experimental data; and
   (e) a data storage module (124), operatively coupled to the microcontroller (128), for storing the set of experimental data and the set of instructions, wherein each resultant current produced by the analyte in response to the potential sweep is converted to a resulting potential by the working electrode (134), wherein each resulting potential is offset by 2.048 volts, via the 2.048 volt voltage offset source (132), and amplified by the gain control module (130), wherein each resulting potential is digitized by the 16-bit ADC (126) and passed to the microcontroller (128), wherein the microcontroller (128) sends a digitized version of each resulting potential to the user interface (148) for user accessibility, wherein the microcontroller (128) sends the digitized version of each resulting potential to the data storage module (124) for storing.

8. The device (100) of claim 7, wherein the gain control module (130) amplifies each resulting potential to be within about 0-4.096 volts prior to digitization by the 16-bit ADC (126).

9. The device (100) of claim 7, wherein the gain control module (130) is further configured to perform an adaptive gain control, wherein if a resultant current produced by the analyte exceeds a pre-determined threshold, the microcontroller (128) sends a signal to the gain control module (130) to switch to a resistor having a lower resistance value than a currently employed resistor, thus changing a gain of the device (100) and effectively lowering a resultant current to voltage conversion factor.

10. The device (100) of claim 7 further comprising a dummy cell (138) comprising a resistor having a first end operatively coupled to the working electrode (134), wherein a second end of the resistor is operatively coupled to the reference electrode (102) and the counter electrode (104).

11. The device (100) of claim 10, wherein the user interface (148) comprises:
(a) a touch screen display (142) offering a first selection for calibrating the device (100), a second selection for choosing anodic stripping voltammetry as the electrochemical experiment to be performed, and a third selection for choosing cyclic voltammetry as the electrochemical experiment to be performed, wherein the touch screen display (142) displays the set of experimental data and the analysis and interpretation of said data; and
(b) a single board computer (140) operatively coupled to the touch screen display (142) and the microcontroller (128), wherein the single board computer (140) performs the analysis and interpretation of the set of experimental data,
wherein after the user makes a selection via the touch screen display (142), the single board computer (140) communicates said selection to the microcontroller (128), wherein the microcontroller (128) communicates with the waveform control module (106) to produce the potential sweep fitting for anodic stripping voltammetry or cyclic voltammetry based on the selection,
wherein the user may alternately choose to calibrate the device (100), wherein said calibration entails applying a variety of potentials to the dummy cell (138) and measuring each resultant current, wherein measurements of said resultant currents are then compared to expected current values stored in the data storage module (124), wherein the microcontroller (128) calculates a correction factor, based on a deviation of a resultant waveform module output potential from expected output potential, and communicates the correction factor to the 12-bit DAC for adjusting the potential sweep.

12. A method for performing an electrochemical experiment via a portable potentiostat device effective for decreasing an amount of noise generated in the electrochemical experiment by employing a digital to analog converter ("DAC") operatively coupled to an analog integrating operational amplifier, herein referred to as an integrator, for generating a plurality of increasing and decreasing potentials comprising a potential sweep applied to an analyte during the electrochemical experiment, wherein an analysis and interpretation of a set of experimental data generated by said experiment is performed by the device so that a user, with or without prior knowledge of electrochemistry, is able to execute the electrochemical experiment, the method comprising:
(a) providing the portable potentiostat device comprising:
(i) a potential control module comprising a reference electrode operatively coupled to a counter electrode;
(ii) a waveform control module (106) for generating the potential sweep, the waveform control module (106) comprising the DAC (116), an inverter (114) having an input connected to an output of the DAC, a solid state relay ("SSR") (110) having a first SSR input connected to the output of the DAC and a second SSR input connected to an output of the inverter (114), and the integrator (108) having a first integrator input connected to a first SSR output, a second integrator input connected to a second SSR output, and an integrator output connected to an output of the reference electrode and an input of the counter electrode;
(iii) an electrochemical cell comprising a connection to the reference electrode, a connection to the counter electrode, and the analyte;
(iv) a data acquisition module comprising a microcontroller operatively coupled to a gain control module comprising a plurality of resistors of various resistance values, wherein the data acquisition module also comprises a working electrode, which couples the gain control module to the electrochemical cell;
(v) a user interface comprising a touch screen display and a single board computer both operatively coupled to the microcontroller, wherein the single board computer is operatively coupled to the touch screen display; and
(vi) a power source providing power to the reference electrode, the working electrode, and the counter electrode thus enabling portability of the portable potentiostat device;
(b) initiating the electrochemical experiment by selecting a type of experiment to be performed via the touch screen, wherein a first selection is anodic stripping voltammetry and a second selection is cyclic voltammetry;
(c) sending a first signal, indicating the type of experiment to be performed, from the touch screen display to the microcontroller;
(d) sending a second signal, via the microcontroller, to the waveform control module, wherein the second signal indicates a type of the potential sweep to be generated by the waveform control module based on the type of experiment selected, wherein each potential of the potential sweep is applied across the reference electrode and the working electrode;
(e) applying the potential sweep to the analyte via the reference electrode and the counter electrode and measuring a resultant current produced by the analyte in response to each potential applied;
(f) employing an adaptive gain control, wherein when the resultant current exceeds a pre-determined threshold, the microcontroller will send a third signal to the gain control module to switch to a resistor having a lower resistance value than a currently employed resistor, thus changing a gain of the portable potentiostat device and effectively lowering a resultant current to voltage conversion factor;
(g) performing an analysis of the set of experimental data, comprising each potential applied and an associated resultant current, and generating an interpretation of said data via the single board computer; and
(h) displaying the set of experimental data, the analysis and interpretation via the touch screen display.

13. The method of claim 12, wherein the user calibrates the portable potentiostat device by choosing a third selection, wherein calibration comprises applying a variety of potentials to a dummy cell and measuring each resultant current, wherein measurements of said resultant currents are then compared to expected current values, stored in the microcontroller, and adjusted accordingly.

14. The method of claim 13, wherein the dummy cell comprises a resistor having a first end operatively coupled to the working electrode, wherein a second end of the resistor is operatively coupled to the reference electrode and the counter electrode.

15. The method of claim 12, wherein the potential sweep generated ranges from about ±2.0 volts at a sweep rate of about 5 millivolts per second to about 400 millivolts per second.

16. The method of claim 12, wherein the DAC is a 12-bit DAC.

17. The method of claim 16, wherein the waveform control module further comprises another inverter (112) having an input connected to the output of the 12-bit DAC and an output connected to the output of the integrator,
wherein use of the 12-bit DAC and the integrator, for generating the analog signal from which the plurality of increasing and decreasing potentials comprising the potential sweep are based, decreases experimental noise as compared to use of a digitally controlled step ramp to generate the plurality of increasing and decreasing potentials.

18. The method of claim 17, wherein the first digital input is a 1.8 volt reference source and the second digital input is a 4.1 volt reference source.

19. The method of claim 17, wherein the data acquisition module further comprises:
  (a) a 16-bit analog to digital converter ("ADC"), operatively coupled to the reference electrode;
  (b) the gain control module operatively coupled to the 16-bit ADC;
  (c) a 2.048 volt voltage offset source having an output operatively coupled to the gain control module, wherein an input to the 2.048 volt voltage offset source is operatively coupled to the working electrode,
  wherein the microcontroller is operatively coupled to the gain control module, the 16-bit ADC, the 12-bit DAC, and the SSR, wherein the microcontroller executes a set of instructions for analyzing and interpreting the set of experimental data; and
  (d) a data storage module, operatively coupled to the microcontroller, for storing the set of experimental data and the set of instructions,
wherein each resultant current produced by the analyte in response to the potential sweep is converted to a resulting potential by the working electrode, wherein each resulting potential is offset by 2.048 volts, via the 2.048 volt voltage offset source, and amplified by the gain control module, wherein each resulting potential is digitized by the 16-bit ADC and passed to the microcontroller, wherein the microcontroller sends a digitized version of each resulting potential to the user interface for user accessibility, wherein the microcontroller sends the digitized version of each resulting potential to the data storage module for storing.

20. The method of claim 19, wherein the gain control module amplifies each resulting potential to be within about 0-4.096 volts prior to digitization by the 16-bit ADC.

* * * * *